United States Patent
Yang

(10) Patent No.: US 7,538,371 B2
(45) Date of Patent: May 26, 2009

(54) CMOS IMAGE SENSOR INTEGRATED WITH 1-T SRAM AND FABRICATION METHOD THEREOF

(75) Inventor: Jinsheng Yang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 75 days.

(21) Appl. No.: 11/162,228

(22) Filed: Sep. 1, 2005

(65) Prior Publication Data
US 2007/0045763 A1 Mar. 1, 2007

(51) Int. Cl.
*H01L 31/113* (2006.01)

(52) U.S. Cl. .............. 257/290; 257/303; 257/306; 257/532

(58) Field of Classification Search .......... 257/290, 257/303, 306, 532
See application file for complete search history.

(56) References Cited

U.S. PATENT DOCUMENTS

| | | | |
|---|---|---|---|
| 6,563,187 B1 * | 5/2003 | Park .................. | 257/446 |
| 6,573,010 B2 | 6/2003 | Kling et al. | |
| 6,633,831 B2 | 10/2003 | Nikoonahad et al. | |
| 6,642,098 B2 * | 11/2003 | Leung et al. .......... | 438/241 |
| 6,673,637 B2 | 1/2004 | Wack et al. | |
| 6,806,951 B2 | 10/2004 | Wack et al. | |
| 7,098,102 B2 * | 8/2006 | Lee et al. ............. | 438/243 |
| 7,148,869 B2 | 12/2006 | Chen et al. | |
| 2002/0053672 A1 | 5/2002 | Yamazaki et al. | |
| 2004/0195600 A1 | 10/2004 | Rhodes | |
| 2006/0256273 A1 | 11/2006 | Yamazaki | |

FOREIGN PATENT DOCUMENTS

| | | |
|---|---|---|
| TW | 1230370 | 4/2005 |
| TW | M264775 | 5/2005 |

OTHER PUBLICATIONS

Wingyu Leung et al., "The Ideal SoC Memory: 1T-SRAM", ASIC/SOC Conference, 2000. Proceedings. 13th Annual IEEE International Volume, Issue, 2000 pp. 32-36.

* cited by examiner

*Primary Examiner*—Long Pham
(74) *Attorney, Agent, or Firm*—Winston Hsu

(57) ABSTRACT

A CMOS image sensor integrated with 1T-SRAM is provided on a substrate having a pixel array part, a logic circuit part, and a memory part by adding only one photoresist process. There are a plurality of CMOS image sensor devices in the pixel array part, a logic circuit in the logic circuit part, and a plurality of 1T-SRAMs in the memory part, and each part is isolated by a plurality of STI regions. The 1T-SRAM includes a capacitor structure and a transistor. The capacitor structure includes a well region as a bottom capacitor plate, a capacitor dielectric layer, and a top capacitor plate formed on the substrate respectively. The transistor includes a gate dielectric layer, a gate, a drain, and a source continuous with and electrically connected to the well region.

5 Claims, 11 Drawing Sheets

CMOS IMAGE SENSOR INTEGRATED WITH 1-T SRAM AND FABRICATION METHOD THEREOF

BACKGROUND OF THE INVENTION

1. Field of the Invention

The present invention relates to a CMOS image sensor integrated with a static random access memory (SRAM), and more particularly, to a CMOS image sensor integrated with a one-transistor static random access memory (1T-SRAM) of ultra-density.

2. Description of the Prior Art

Complementary metal-oxide semiconductor (CMOS) image sensors are produced by using conventional semiconductor techniques, which can fabricate the image sensor and the related peripheral circuit simultaneously. When compared with a charge-coupled device (CCD), which requires 30 to 40 mask processes during manufacture, the CMOS image sensor only requires approximately 20 mask processes. CMOS sensors not only simplify the manufacturing process, but also reduce cost. In addition, CMOS image sensors have advantages of small size, high quantum efficiency, and low read-out noise.

However, since memory, such as dynamic random access memory (DRAM) and image sensor devices are manufactured on different chips, miniaturization of the image system is difficult. U.S. Pat. No. 6,563,187 teaches a CMOS image sensor, and particularly, a CMOS image sensor integrated with image sensor devices, a related signal processing circuit, and memory, such as DRAM or SRAM to reduce the cost and the power consumption.

However, a typical DRAM has to check a voltage on its capacitor periodically, and needs to charge or discharge in order to refresh the capacitor. In addition, if the image sensor is integrated with an SRAM comprising 4 to 6 transistors, it will have an area of more than 4 times the area of an image sensor integrated with a DRAM. The result is a reduced integrity, and a less than compact size. Additionally, the method disclosed in the '187 patent is to integrate the memory after all the logic devices have been formed. Such a process is overly complicated.

SUMMARY OF THE INVENTION

Therefore, a primary object of the present invention is to provide a CMOS image sensor integrated with 1T-SRAM of ultra-high density and a fabrication method thereof.

According to one of the preferred embodiments of the invention, a semiconductor substrate is provided. The substrate has a pixel array part, a logic circuit part, and a memory part defined therein. The pixel array part, the logic circuit part, and the memory part are isolated from each other by a plurality of shallow trench isolation (STI) regions. There are a plurality of CMOS image sensor devices in the pixel array part, a logic circuit in the logic circuit part, and a plurality of 1T-SRAM cells in the memory part. An 1T-SRAM cell includes a capacitor structure and a transistor. The capacitor structure includes a well region formed by implanting ions in the substrate as a bottom capacitor plate, a capacitor dielectric layer formed above the well region, and a top capacitor plate formed above the dielectric layer. The transistor includes a gate dielectric layer, a gate, a drain, and a source continuous with the well region beneath the top capacitor plate and electrically connecting to it. The capacitor dielectric layer of the capacitor structure and the gate dielectric layer of the transistor are the same layer.

The capacitor dielectric layer of the capacitor structure provided by the present invention can be the same layer as the gate dielectric layer of the transistor, which means that the capacitor dielectric layer of the capacitor structure and the gate dielectric layer of the transistor are formed simultaneously. Similarly, the top capacitor plate of the capacitor structure and the gate of the transistor are also formed simultaneously. Therefore the present invention provides a CMOS image sensor integrating ultra-high density 1T-SRAM with logic devices by adding only one photomask process to the whole logic process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
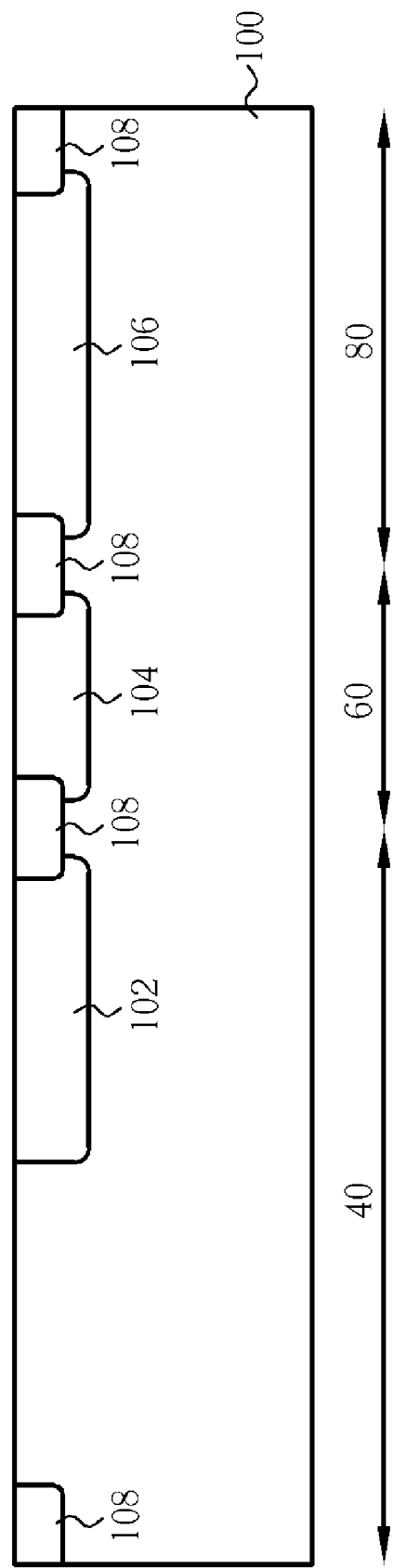
FIGS. 1 to 7 are cross-sectional views illustrating a chip on which CMOS image sensor devices, logic circuit devices and 1T-SRAM cells are integrated in accordance with the first embodiment of the present invention.

Please refer to FIGS. 1 to 7 illustrating a chip on which CMOS image sensor devices, logic circuit devices, and 1T-SRAM cells are integrated in accordance with the present invention. First, a substrate 100, such as a wafer, is provided on which a pixel array part 40, a logic circuit part 60, and a memory part 80 are defined in specific areas. As illustrated in FIG. 1, a P well 102 is formed in the pixel array part 40, an N well 104 is formed in the logic circuit part 60, and another P well 106 is formed in the memory part 80. There are plurality of shallow trench isolation (STI) regions 108 formed in the substrate 100 to isolate the pixel array part 40, the logic circuit 60, and the memory part 80 from each other.

Figure 2:
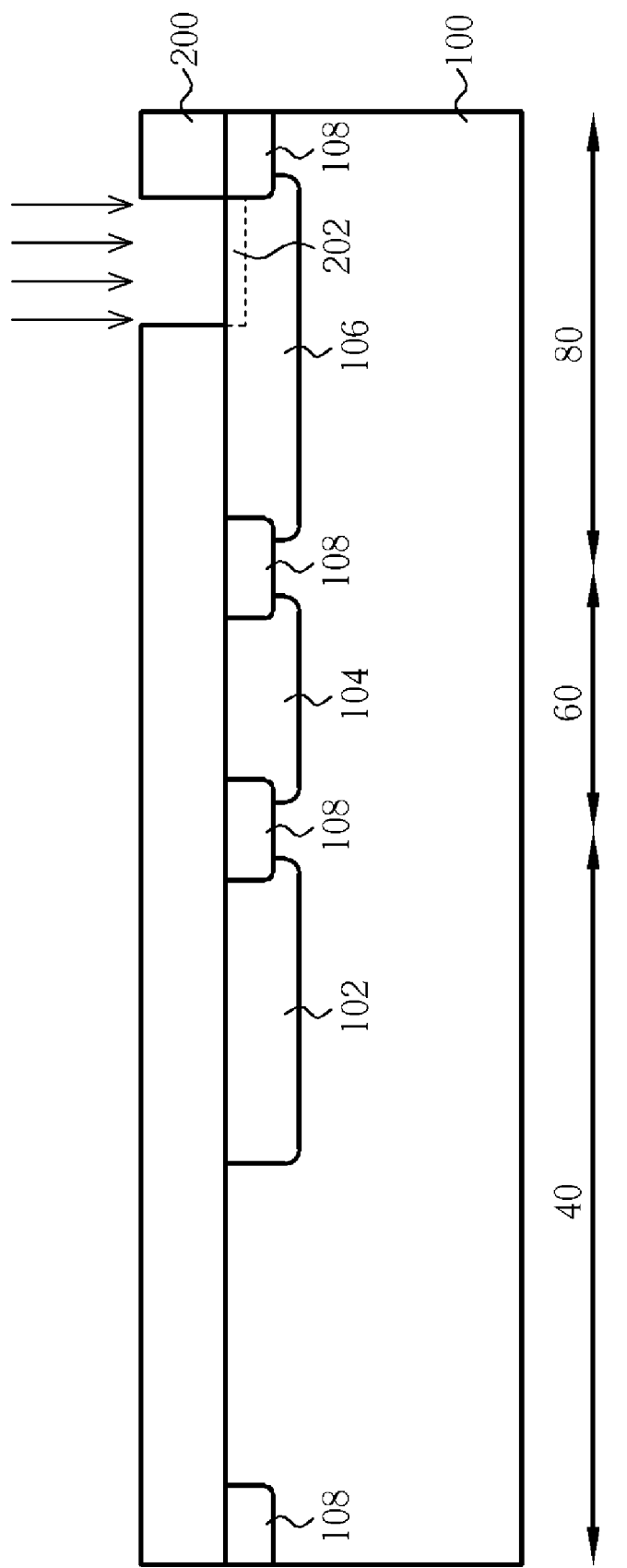

Referring to FIG. 2, a patterned photoresist layer 200 having an opening is then formed on the substrate 100. Then, an ion implanting process is performed through the opening of the photoresist layer 200 to form a well region 202 as a bottom capacitor plate.

Figure 3:
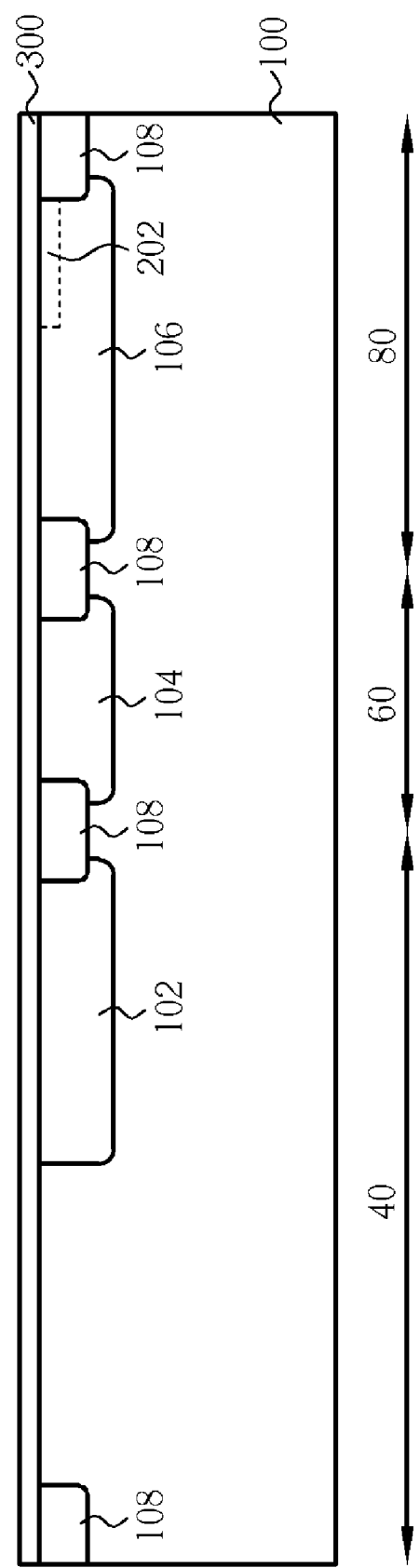

Referring to FIG. 3, after removing the photoresist layer 200, a dielectric layer 300 such as silicon oxide or silicon nitride is formed over the substrate 100. The thickness of the dielectric layer 300 can be varied depending on the circuit design or the device being used and can be different in the pixel array part 40, the logic circuit part 60, and the memory part 80. For convenience, the dielectric layer 300 having uniform thickness is assumed in this embodiment. The dielectric layer 300 is used for the gate oxide of the transistor in the pixel array part 40, the logic circuit part 60, and the transistor and dielectric layer of the capacitor of the 1T-SRAM cell in the memory part 80. However, in other embodiments, the gate oxide and the capacitor dielectric layer can be different in thickness and/or composition by performing multiple processes. For example, the capacitor dielectric layer can be formed from silicon nitride, a combination of silicon oxide and silicon nitride, or the material of high dielectric constant while the gate oxide can be formed from silicon oxide, silicon oxynitride, or material of high dielectric constant.

Figure 4:
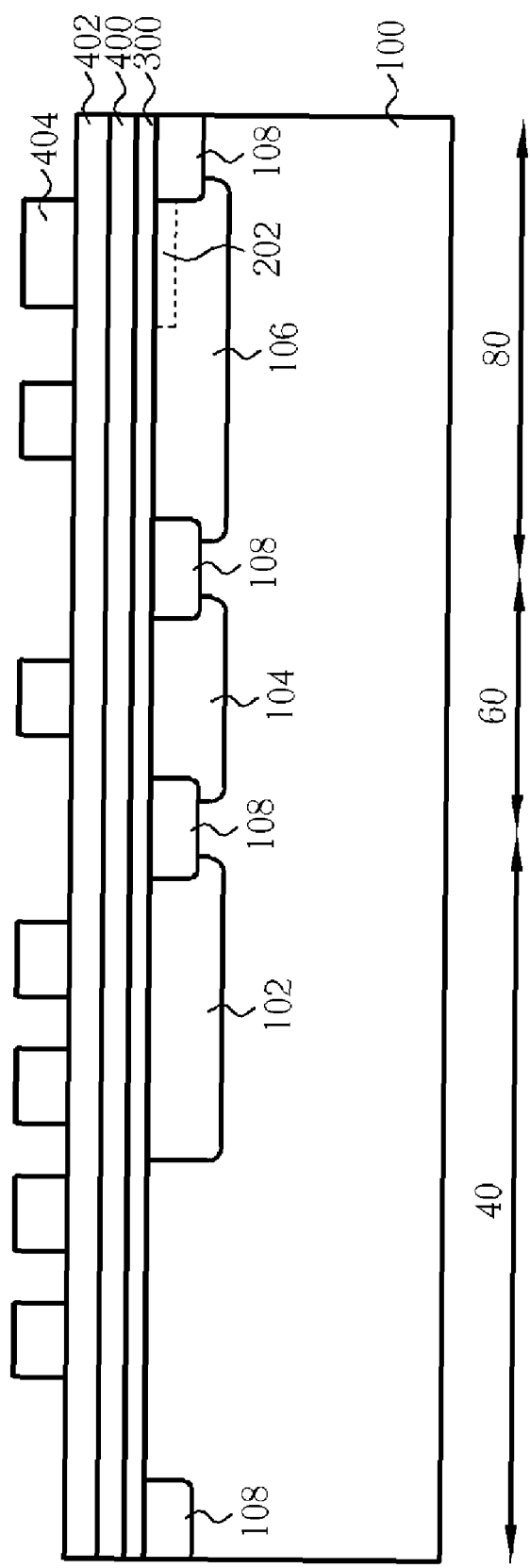
Figure 5:
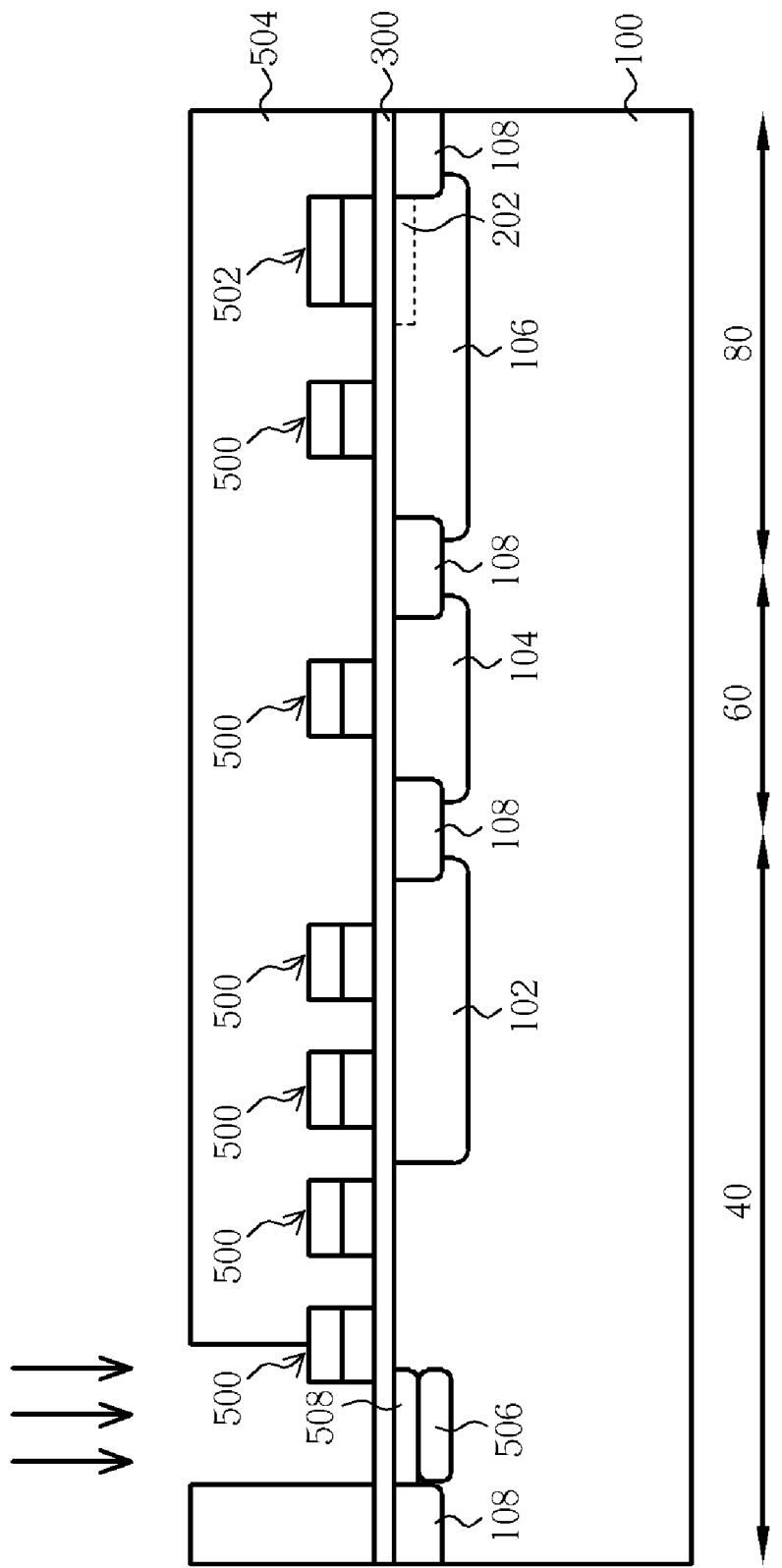

Referring to FIGS. 4 and 5, a polysilicon layer 400 is formed on the dielectric layer 300 and a polycide layer 402 is selectively formed on the polysilicon layer 400. A silicide process is performed subsequently. In this embodiment, the polysilicon layer 400 and the metal silicide layer 402 are formed for comprising the gate. Nevertheless, the present invention is not limited to this, the polysilicon layer 400 can be used solely to form the gate. Then, a patterned photoresist layer 404 is formed on the metal silicide layer 402 to define each gate of the transistor in the pixel array part 40, the logic circuit part 60, the memory part 80, and the top capacitor plate of the capacitor structure in the memory part 80. The photoresist layer 404 is used as an etching mask in the following etching process. After removing the photoresist layer 404, a plurality of gates 500 of the transistor, and a top capacitor plate 502 of the capacitor structure are simultaneously formed.

Please refer to FIG. 5 again. A patterned photoresist layer 504 used for an ion implanting mask is formed on the substrate 100, defining a light sensing area of the image sensor device. Then, an ion implanting process is performed on the substrate 100 to form a deep N region 506, and another ion implanting process is performed to form a shallow P region 508 with the same photoresist layer.

Figure 6:
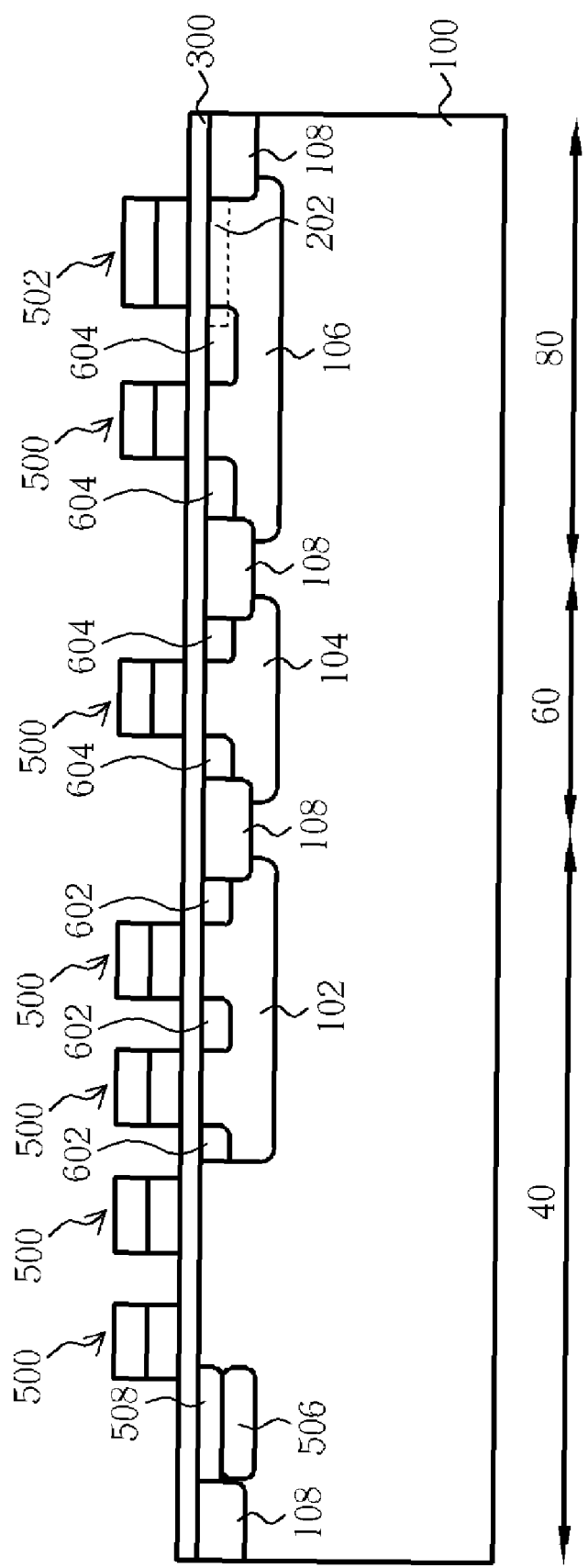

Referring to FIG. 6, after removing the photoresist layer 504, a mask, such as a patterned photoresist layer (not shown), is used to form a plurality of N-type lightly doped drains (LDDs) 602 in the P well 102 in the pixel array part 40. Another mask is used to form a plurality of P-type LDDs 604 in the N well 104 in the logic circuit part 60 and in the N well 106 in the memory part 80.

Figure 7:
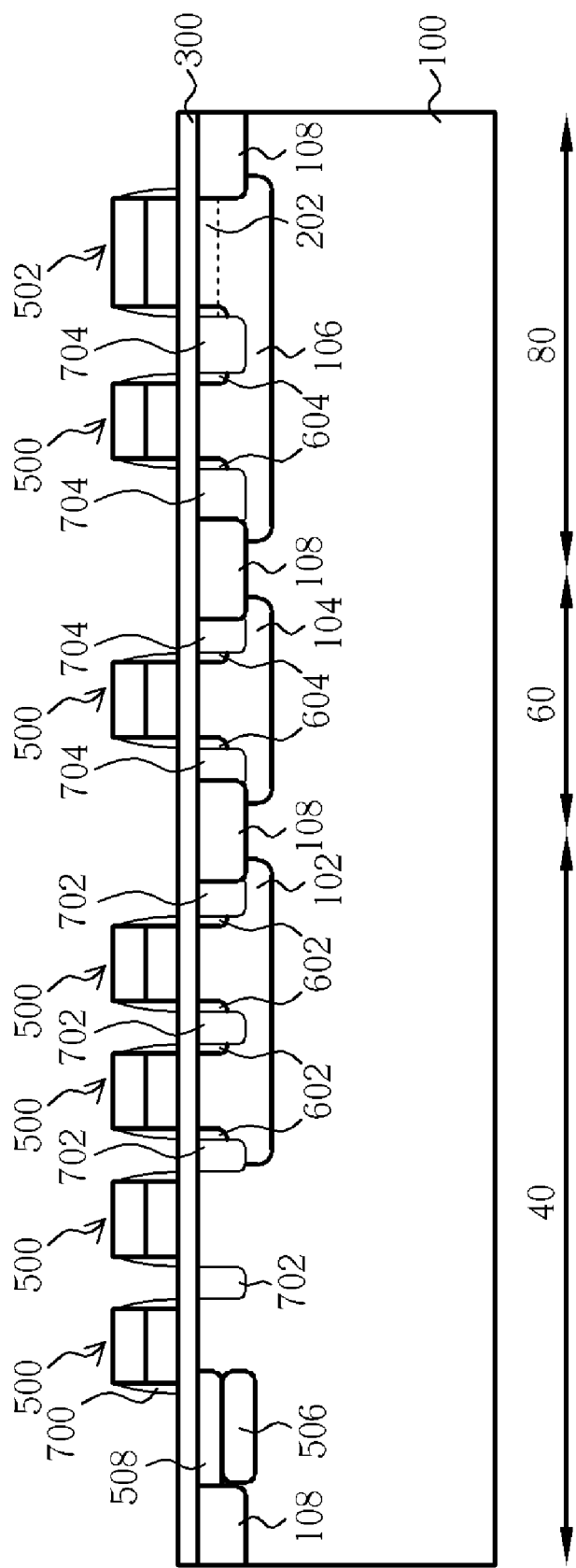

As illustrated in FIG. 7, a plurality of spacers 700 are formed besides the gates 500 of the transistors in the pixel array part 40, the logic circuit part 60 and the memory part 80. After forming the spacers 700, a mask, such as a patterned photoresist layer (not shown), is used to form a plurality of N-type heavily doped drains (HDDs) 702 in the P well 102 in the pixel array part 40. Another proper mask is used to form a plurality of P-type HDDs 704 in the N well 104 in the logic circuit part 60 and the N well 106 in the memory part 80.

In addition, to satisfy the demand of high integrity and high capacitor area, the present invention also provides a second preferred embodiment. As described above, the second embodiment also provides a substrate 100, such as a wafer, on which a pixel array part 40, a logic circuit part 60, and a memory part 80 are defined in specific areas. A P well 102 is formed in the pixel array part 40, an N well 104 is formed in the logic circuit part 60, and another P well 106 is formed in the memory part 80. There are plurality of STI regions 108 formed in the substrate 100 to isolate the pixel array part 40, the logic circuit 60, and the memory part 80.

Figure 8:
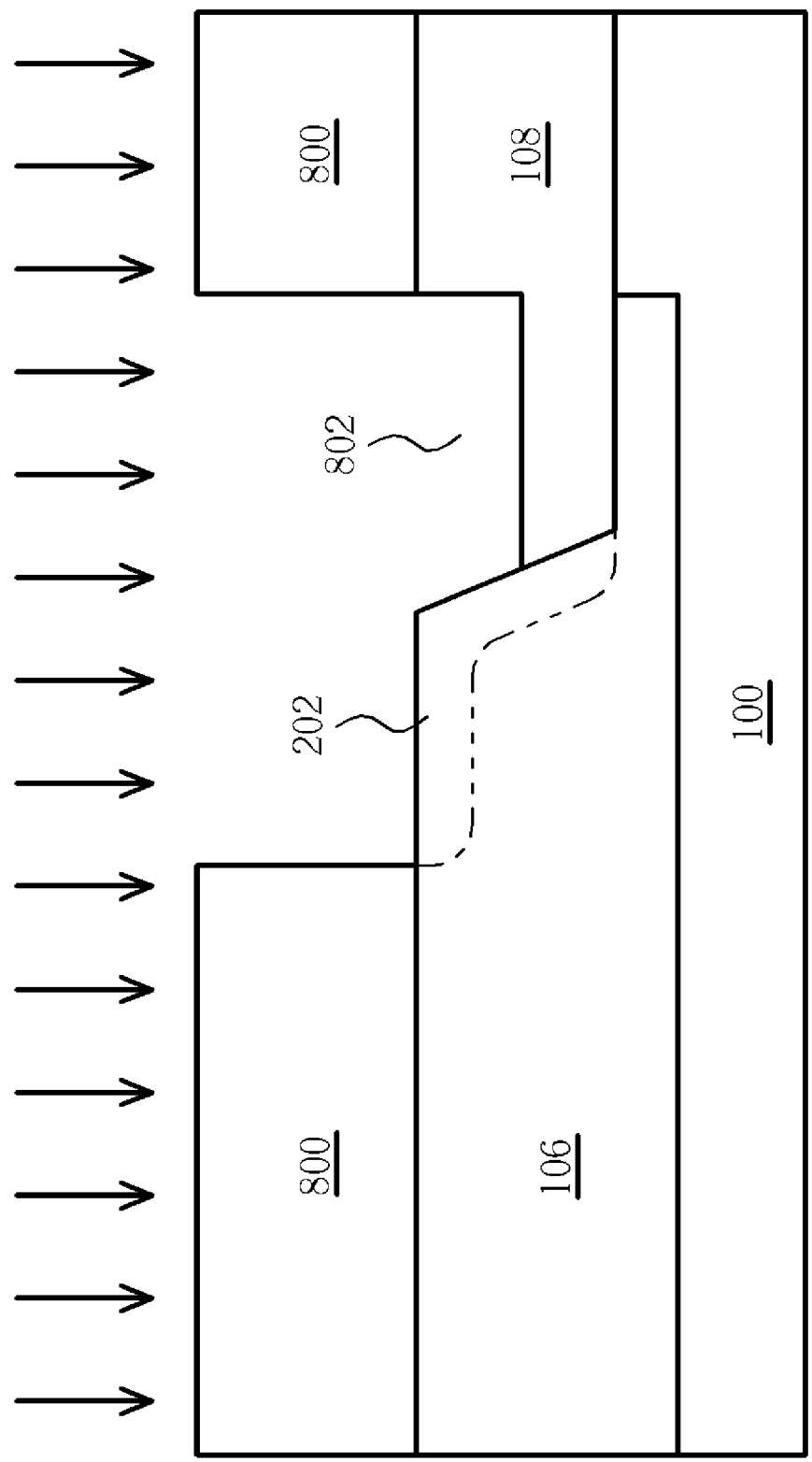
FIGS. 8 to 9 are cross-sectional views of a memory part in accordance with the second embodiment of the present invention.
Figure 9:
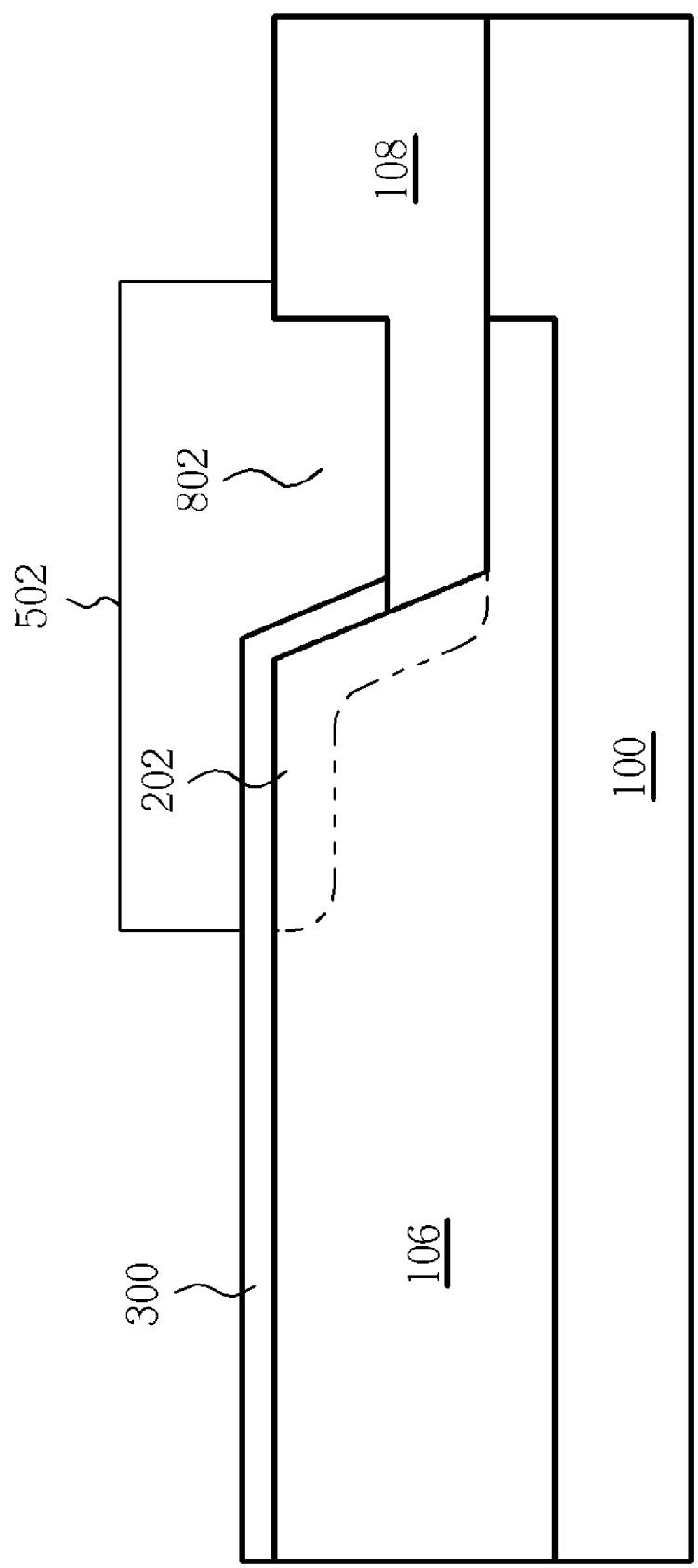

Please refer to FIGS. 8 and 9, which are cross-sectional views of a memory part in accordance with the second embodiment of the present invention. Because the second embodiment's differences are mainly in the process producing the capacitor structure illustrated in FIGS. 2 and 3, only the capacitor structure in the memory part 80 is detailed while other devices are produced by the process illustrated in FIGS. 1 to 7. As illustrated in FIG. 8, a patterned photoresist layer 800 having an opening is formed on the substrate 100. The opening exposes part of the substrate 100 and part of the STI region 108. Performing an etching process through the opening of the photoresist layer 800 thereby creates a cavity 802 in the STI region 108 in accordance with the different selectivity between the substrate 100 (silicon) and the STI (silicon dioxide). An ion implanting process is performed on the substrate 100 and the cavity 802 through the opening of the photoresist layer 800 to form a well region 202 as a bottom capacitor plate in a sidewall of the cavity 802 and the exposed substrate 100.

Please refer to FIG. 9. After removing the photoresist layer 800, a dielectric layer 300 is formed on the substrate 100. Again, the dielectric layer 300 is used for the gate oxide of the transistor in the pixel array part 40 and logic circuit part 60, and for the gate oxide of the transistor and the dielectric layer of the capacitor of the 1T-SRAM cell in the memory part 80. Nevertheless, the dielectric layer used for the gate oxide of the transistor and for the capacitor can be separately formed with different material by different processes. In addition, the thickness of the dielectric layer 300 can be varied depending on the circuit design or the device being used, and can be different in the pixel array part 40, the logic circuit part 60, and the memory part 80. What deserves to be mentioned is that due to the different position of the opening of the photoresist layer 800 and the additional etching process through the opening, the dielectric layer 300 covers one of the sidewalls of the cavity 802 and increases the capacitor area. Then, a top capacitor plate 502 is formed on the substrate in the memory part 80. Please note that, in this embodiment, the top capacitor 502 and the gates 500 in the pixel array part 40, the logic circuit part 60 and the memory part 80 are formed separately, which are different from the method described in the first preferred embodiment. Furthermore the step for forming the top capacitor plate 502 can be performed before or after forming the gates 500, depending on the demands. After forming the top capacitor plate 502, the follow-up processes as described above are performed to complete the manufacturing process for the 1T-SRAM CMOS image sensor having a capacitor structure fabricated partially in a cavity.

Figure 10:
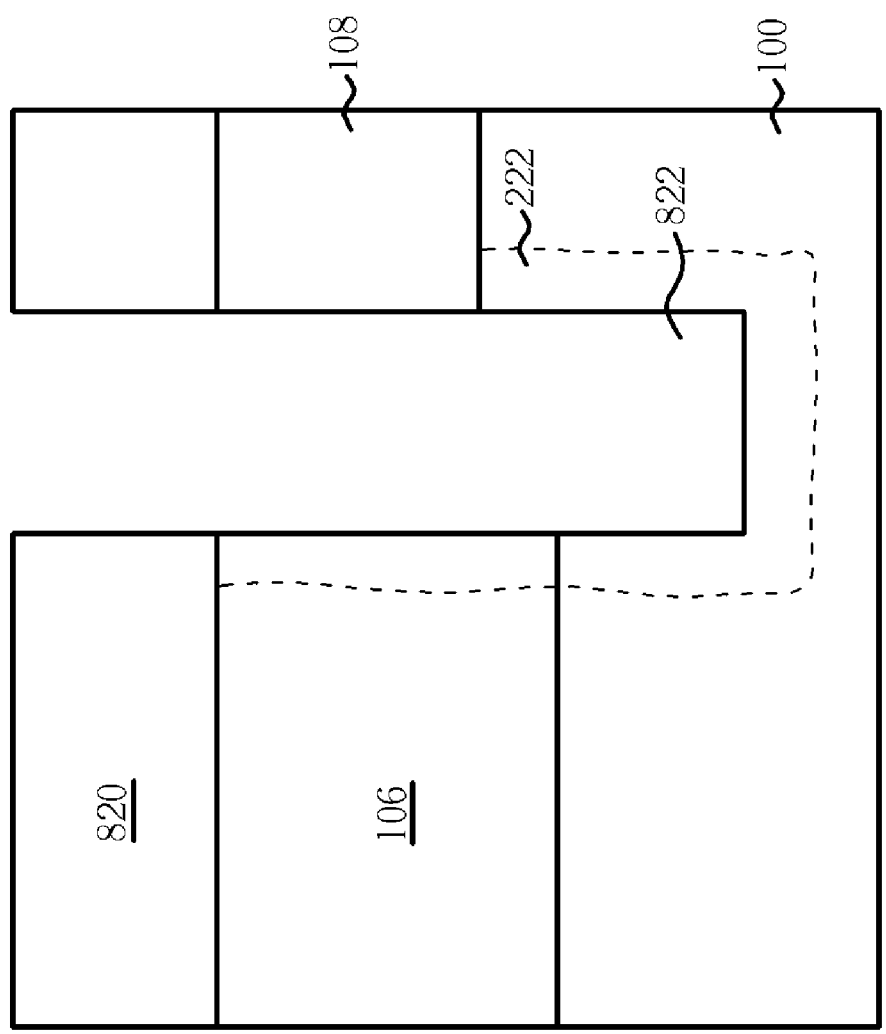
FIGS. 10 to 11 are cross-sectional views of a memory part in accordance with the third embodiment of the present invention.

Furthermore, the present invention provides a third preferred embodiment which relates to a CMOS image sensor integrated with 1T-SRAM having a deep-trenched capacitor. Please refer to FIGS. 10 and 11, which are the cross-sectional views of a memory part 80 in accordance with the third embodiment of the present invention. Because the differences between the second embodiment and the third embodiment are also in the capacitor structure, while the other devices are produced by the process illustrated in FIGS. 1 to 7, only the capacitor structure in the memory part 80 is detailed. As illustrated in FIG. 10, a patterned photoresist layer 820 having an opening is formed on the substrate 100 to expose part of the substrate 100 and part of the STI region 108. Performing an etching process through the opening of the photoresist layer 820 thereby removes the exposed part of the substrate 100 and the exposed part of the STI region 108 and creates a deep trench 822. The deep trench 822 penetrated part of the STI region 108. Then, an arsenic silicate glass (ASG) diffusion method or an angled ion implanting process is used with the photoresist layer 820 as a mask on the substrate 100 and the deep trench 822 to form a well region 222 as a bottom capacitor in the sidewall of the deep trench 822 and the exposed substrate 100.

Figure 11:
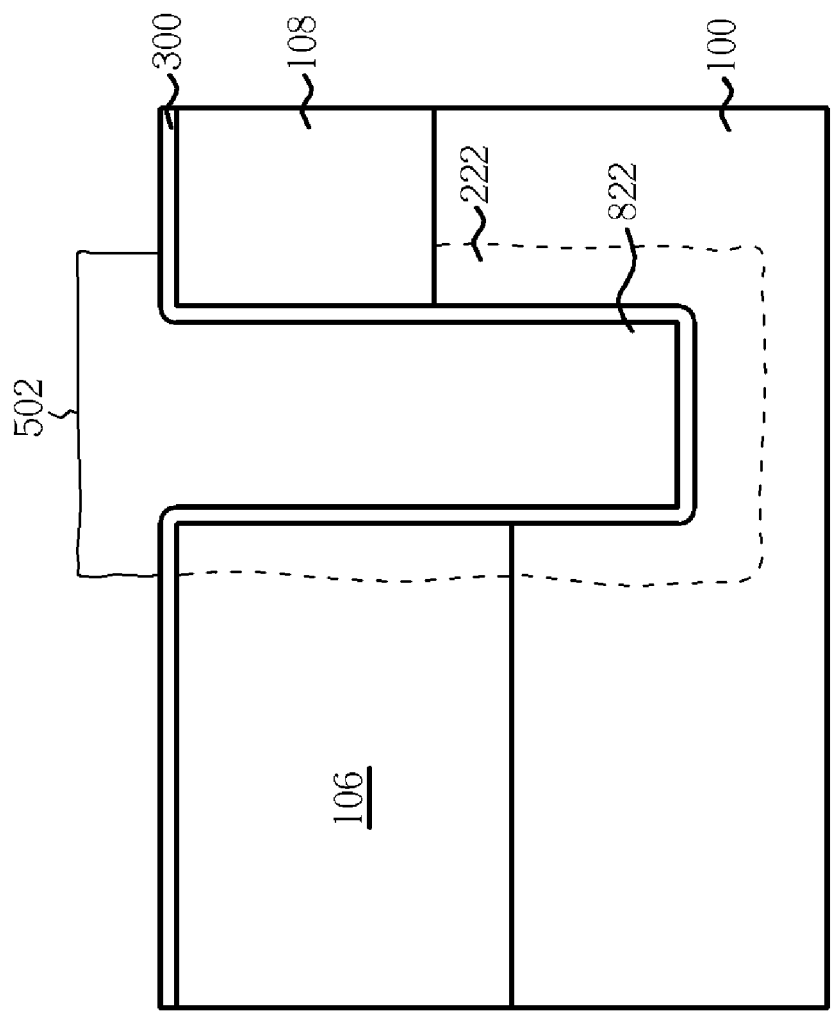

Please refer to FIG. 11. After removing the photoresist layer 820, a dielectric layer 300 is formed on the substrate 100. Again, the dielectric layer 300 is used for the gate oxide of the transistor in the pixel array part 40 and logic circuit part 60, for the gate oxide of the transistor of the capacitor of the 1T-SRAM cell in the memory part 80, It also can be used for the dielectric layer of the capacitor. The thickness and the composition of the dielectric layer 300 can be varied depending on demands. What deserves to be mentioned is that due to the different position of the opening of the photoresist layer 820 and the etching process for forming the deep trench, the well region 222 is positioned within the sidewalls and the bottom of the deep trench and the dielectric layer 300 covers the sidewalls and the bottom of the deep trench 822 to increases the capacitor area. Then, a top capacitor plate 502 is formed on the substrate in the memory part 80. Please note that, in this embodiment, the top capacitor 502 and the gate 500 in the pixel array part 40, the logic circuit part 60 and the memory part 80 are formed separately. And the step for forming the top capacitor plate 502 can be performed before or after forming the gates 500, depending on the demands. After forming the top capacitor plate 502, the follow-up processes are performed on the substrate 100 as described above to complete the manufacturing process for the 1T-SRAM CMOS image sensor having a deep-trench capacitor.

According to the present invention, a CMOS image sensor integrated with the image sensor devices, the logic circuit, and the 1T-SRAM is provided. Compared with the conventional technique, the claimed invention is a CMOS image sensor integrated with ultra-density 1T-SRAM by only adding one photo mask process to the logic process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A CMOS image sensor integrated with 1T-SRAM comprising:
    a substrate having a pixel array part, a logic circuit part, and a memory part;
    a pixel array positioned in the pixel array part;
    a logic circuit positioned in the logic circuit part;
    a plurality of one-transistor static random access memory (1T-SRAM) cells comprising a capacitor structure and a transistor positioned in the memory part; and
    a first shallow trench isolation (STI) positioned on a side of the capacitor structure in the substrate for providing an electrical isolation; wherein
    the capacitor structure, comprising a well region serving as a bottom capacitor plate, a top capacitor plate, and a dielectric layer positioned above the well region and extending to a surface of the substrate; the capacitor structure penetrates a portion of the first STI, the well region is positioned within a plurality of sidewalls and the bottom of a deep trench and contacting a bottom of the first STI; and the dielectric layer covers the sidewalls and the bottom of the deep trench.

2. The CMOS image sensor integrated with 1T-SRAM of claim 1, further comprising a plurality of second shallow trench isolation (STI) regions formed in the substrate to isolate the pixel array, the logic circuit, and the 1T-SRAM cells.

3. The CMOS image sensor integrated with 1T-SRAM of claim 1, further comprising a plurality of wells within the substrate of the pixel array part, the logic circuit part, and the memory part.

4. The CMOS image sensor integrated with 1T-SRAM of claim 1, wherein
    the transistor electrically connected to the capacitor structure comprises:
        a gate dielectric layer positioned on the substrate of the memory part;
        a gate positioned above the gate dielectric layer;
        a source positioned in the substrate between the gate and the capacitor structure and electrically connected to the well region; and
        a drain positioned at the side opposite to the source in the substrate.

5. The CMOS image sensor integrated with 1T-SRAM of claim 4, wherein the capacitor dielectric layer and the gate dielectric layer have different thickness.

* * * * *